US008859962B2

(12) United States Patent
Takahashi et al.

(10) Patent No.: US 8,859,962 B2
(45) Date of Patent: Oct. 14, 2014

(54) CHARGED-PARTICLE MICROSCOPE

(71) Applicant: Hitachi High-Technologies Corporation, Tokyo (JP)

(72) Inventors: Noritsugu Takahashi, Kokubunji (JP); Muneyuki Fukuda, Kokubunji (JP); Manabu Yano, Hitachiomiya (JP); Hirohiko Kitsuki, Hitachinaka (JP); Kazunari Asao, Tokai (JP); Tomoyasu Shojo, Saitama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/215,209

(22) Filed: Mar. 17, 2014

(65) Prior Publication Data

US 2014/0197313 A1    Jul. 17, 2014

Related U.S. Application Data

(63) Continuation of application No. 13/386,717, filed as application No. PCT/JP2010/004532 on Jul. 13, 2010.

(30) Foreign Application Priority Data

Aug. 3, 2009 (JP) ................................. 2009-180722

(51) Int. Cl.
*G01N 23/00* (2006.01)
*H01J 37/28* (2006.01)
*H01J 37/10* (2006.01)

(52) U.S. Cl.
CPC *H01J 37/28* (2013.01); *H01J 37/10* (2013.01)
USPC ........... 250/306; 250/307; 250/310; 250/311; 250/309

(58) Field of Classification Search
None
See application file for complete search history.

(56) References Cited

U.S. PATENT DOCUMENTS

| | | | | |
|---|---|---|---|---|
| 5,770,863 | A * | 6/1998 | Nakasuji | 250/492.2 |
| 5,973,333 | A * | 10/1999 | Nakasuji et al. | 250/492.23 |
| 6,037,589 | A * | 3/2000 | Yonezawa et al. | 250/310 |
| 6,278,114 | B1 * | 8/2001 | Mitsui | 250/310 |
| 7,501,638 | B1 * | 3/2009 | Zhou | 250/396 R |
| 2003/0218133 | A1 * | 11/2003 | Petrov et al. | 250/310 |
| 2005/0035291 | A1 * | 2/2005 | Hill et al. | 250/309 |
| 2006/0043294 | A1 * | 3/2006 | Yamaguchi et al. | 250/310 |
| 2006/0284087 | A1 * | 12/2006 | Agemura et al. | 250/309 |

(Continued)

FOREIGN PATENT DOCUMENTS

| | | | | | |
|---|---|---|---|---|---|
| EP | 1801838 | A1 * | 6/2007 | | H01J 3/06 |
| EP | 1801838 | B1 * | 5/2012 | | |

(Continued)

*Primary Examiner* — Andrew Smyth
(74) *Attorney, Agent, or Firm* — Mattingly & Malur, PC

(57) ABSTRACT

A charged-particle-beam device is characterized in having a control value for an aligner coil (29) being determined by: a coil current and an electrode applied-voltage at a control value for objectives (30, 31), which is an electromagnetic-field superposition lens; a control value for image-shift coils (27, 28); and the acceleration voltage of the charged-particle-beam. By doing this, it has become possible to avoid image disturbances that occur on images to be displayed at boundaries between charged areas and non-charged areas, and provide a charged-particle-beam device that obtains clear images without any unevenness in brightness.

7 Claims, 11 Drawing Sheets

(56) References Cited

U.S. PATENT DOCUMENTS

| | | |
|---|---|---|
| 2007/0057687 A1* | 3/2007 | Kadyshevitch et al. ...... 324/765 |
| 2007/0131877 A9* | 6/2007 | Hiroi et al. ................. 250/492.2 |
| 2007/0158565 A1* | 7/2007 | Nakasuji et al. ............. 250/310 |
| 2007/0221860 A1* | 9/2007 | Kawasaki et al. ............ 250/398 |
| 2008/0035860 A1* | 2/2008 | Hill et al. .................... 250/492.3 |
| 2008/0099673 A1* | 5/2008 | Fukuda et al. ............... 250/307 |
| 2008/0116391 A1* | 5/2008 | Ito et al. ................. 250/396 ML |
| 2008/0283744 A1* | 11/2008 | Takada et al. ............... 250/307 |
| 2009/0212213 A1* | 8/2009 | Nakasuji et al. ............. 250/310 |
| 2009/0272899 A1* | 11/2009 | Yamazaki et al. ............ 250/307 |

FOREIGN PATENT DOCUMENTS

| | | | | |
|---|---|---|---|---|
| JP | 10247465 | | 9/1998 | |
| JP | 10247465 A | * | 9/1998 | ............ H01J 37/153 |
| JP | 2000156192 | | 6/2000 | |
| JP | 2000156192 A | * | 6/2000 | ............ H01J 37/147 |
| JP | 2000195453 | | 7/2000 | |
| JP | 2000195453 A | * | 7/2000 | ............ H01J 37/04 |
| JP | 2004235062 | | 8/2004 | |
| JP | 2004235062 A | * | 8/2004 | ............ H01J 37/12 |
| JP | 2008282826 | | 11/2008 | |
| JP | 2008282826 A | * | 11/2008 | |
| WO | WO 2006093268 A1 | * | 9/2006 | |

* cited by examiner

FIG. 2

| IMAGE-SHIFT COIL X | IMAGE-SHIFT COIL Y | CORRECTION VALUE OF OPTICAL TRAJECTORY ADJUSTER X | CORRECTION VALUE OF OPTICAL TRAJECTORY ADJUSTER Y |
|---|---|---|---|
| C1' | D1' | Bx1 | By1 |
| C2' | D1' | Bx2 | By2 |
| C3' | D1' | Bx3 | By3 |
| C1' | D2' | Bx4 | By4 |
| C2' | D2' | Bx5 | By5 |
| C3' | D2' | Bx6 | By6 |
| C1' | D3' | Bx7 | By7 |
| C2' | D3' | Bx8 | By8 |
| C3' | D3' | Bx9 | By9 |

FIG. 4

1 : AVERAGE HEIGHT OF SAMPLE
2 : MEASUREMENT VALUE OF HEIGHT OF SAMPLE
3 : CONTROL VALUE OF IMAGE-SHIFT DEFLECTOR X
4 : CONTROL VALUE OF IMAGE-SHIFT DEFLECTOR Y
5 : CONTROL VALUE OF ELECTROMAGNETIC OBJECTIVE LENS
6 : CONTROL VALUE OF ELECTROSTATIC OBJECTIVE LENS
7 : CONTROL VALUE OF OPTICAL TRAJECTORY ADJUSTER X
8 : CONTROL VALUE OF OPTICAL TRAJECTORY ADJUSTER Y

ACCELERATION VOLTAGE Va[V]

| #1 | #2 | #3 | #4 | #5 | #6 | #7 | #8 |
|---|---|---|---|---|---|---|---|
| Z1 | Z1 | C1 | D1 | A1 | G | E11 | F11 |
| Z1 | Z1 | C2 | D1 | A1 | G | E12 | F12 |
| Z1 | Z1 | C3 | D1 | A1 | G | E13 | F13 |
| Z1 | Z1 | C1 | D2 | A1 | G | E14 | F14 |
| Z1 | Z1 | C2 | D2 | A1 | G | E15 | F15 |
| Z1 | Z1 | C3 | D2 | A1 | G | E16 | F16 |
| Z1 | Z1 | C1 | D3 | A1 | G | E17 | F17 |
| Z1 | Z1 | C2 | D3 | A1 | G | E18 | F18 |
| Z1 | Z1 | C3 | D3 | A1 | G | E19 | F19 |
| Z1 | Z2 | C1 | D1 | A1 | G+G1 | E21 | F21 |
| Z1 | Z2 | C2 | D1 | A1 | G+G1 | E22 | F22 |
| Z1 | Z2 | C3 | D1 | A1 | G+G1 | E23 | F23 |
| ⋮ | | | | | | | |
| Z1 | Z3 | C1 | D1 | A1 | G+G2 | E31 | F31 |
| ⋮ | | | | | | | |
| Z2 | Z1 | C1 | D1 | A2 | G+G3 | E41 | F41 |
| ⋮ | | | | | | | |
| Z2 | Z2 | C1 | D1 | A2 | G | E51 | F51 |
| Z2 | Z2 | C2 | D1 | A2 | G | E52 | F52 |
| Z2 | Z2 | C3 | D1 | A2 | G | E53 | F53 |
| ⋮ | | | | | | | |
| Z2 | Z3 | C1 | D1 | A2 | G+G4 | E61 | F61 |
| ⋮ | | | | | | | |
| Z3 | Z1 | C1 | D1 | A3 | G+G5 | E71 | F71 |
| ⋮ | | | | | | | |
| Z3 | Z2 | C1 | D1 | A3 | G+G6 | E81 | F81 |
| ⋮ | | | | | | | |
| Z3 | Z3 | C3 | D3 | A3 | G | E99 | F99 |

FIG. 9

1 : AVERAGE HEIGHT OF SAMPLE
2 : MEASUREMENT VALUE OF HEIGHT OF SAMPLE
3 : CONTROL VALUE OF IMAGE-SHIFT DEFLECTOR X
4 : CONTROL VALUE OF IMAGE-SHIFT DEFLECTOR Y
5 : CONTROL VALUE OF VISUAL FIELD SHIFT ADJUSTMENT X
6 : CONTROL VALUE OF VISUAL FIELD SHIFT ADJUSTMENT Y

ACCELERATION VOLTAGE Va[V]

| #1 | #2 | #3 | #4 | #5 | #6 |
|----|----|----|----|----|----|
| Z1 | Z1 | C1 | D1 | H11 | J11 |
| Z1 | Z1 | C2 | D1 | H12 | J12 |
| Z1 | Z1 | C3 | D1 | H13 | J13 |
| Z1 | Z1 | C1 | D2 | H14 | J14 |
| Z1 | Z1 | C2 | D2 | H15 | J15 |
| Z1 | Z1 | C3 | D2 | H16 | J16 |
| Z1 | Z1 | C1 | D3 | H17 | J17 |
| Z1 | Z1 | C2 | D3 | H18 | J18 |
| Z1 | Z1 | C3 | D3 | H19 | J19 |
| Z1 | Z2 | C1 | D1 | H21 | J21 |
| Z1 | Z2 | C2 | D1 | H22 | J22 |
| ⋮ | ⋮ | ⋮ | ⋮ | ⋮ | ⋮ |
| Z1 | Z3 | C1 | D1 | H31 | J31 |
| ⋮ | ⋮ | ⋮ | ⋮ | ⋮ | ⋮ |
| Z2 | Z1 | C1 | D1 | H41 | J41 |
| ⋮ | ⋮ | ⋮ | ⋮ | ⋮ | ⋮ |
| Z3 | Z3 | C3 | D3 | H99 | J99 |

CHARGED-PARTICLE MICROSCOPE

This is a continuation application of U.S. application Ser. No. 13/386,717, filed Jan. 24, 2012 which is a 371 National Stage of PCT/JP2010/004532, filed Jul. 13, 2010, which claims priority to JP 2009-180722, filed Aug. 3, 2009. The entire disclosures of all of these applications are hereby incorporated by reference.

TECHNICAL FIELD

The present invention relates to a charged particle microscope, and more specifically, to a technology that measures or inspects a size or a shape of a circuit pattern formed on a sample.

BACKGROUND ART

The charged particle microscope that is represented by a scanning electron microscope can observe a sample at a high resolution in a nanometer order.

Recently, accompanied by minuteness of the process rule of the semiconductor device, it is required to control a process defect in a nanometer order that occurs during the manufacturing process in terms of the yield. Therefore, a high resolution scanning charged particle microscope technology that uses an immersion lens is applied to a process monitoring apparatus.

In the meantime, the process monitoring apparatus is used in a manufacturing process, and requires a high throughput automatic observation. As a method for improving the throughput, a method that deviates the trajectory of the primary charged particle beam using a deflector lens to move the observation portion (hereinafter, referred to as an image shift). Since the image shift is performed by shifting the trajectory of the primary charged particle beam from an axis of the lens, the resolution is degraded due to the increase of off-axis aberrations. Therefore, the image shift is not suitable for the movement of the visual field in a millimeter order. However, the influence of the degradation of the resolution is small in the movement of the visual field of a micrometer order. Therefore, the image shift is largely used for a process monitoring apparatus that frequently moves the visual field of a micrometer order.

Generally, a deflector unit that is used for image shift is configured by upper deflector and lower deflector. The upper deflector deflects the trajectory out of the axis and the lower deflector deflects the trajectory so as to be returned, so that the beam passes through an axial center of an objective lens, thereby reducing the off-axis aberrations. The ratio of the strength between the upper deflector and the lower deflector (hereinafter, an upper and lower ratio) is affected by the rotation of the primary charged particle beam by the above-mentioned objective lens so that the condition where an optimal resolution is obtained is changed by the deflection distance of the image shift. Therefore, it is required that the upper and lower ratio is reset according to the change in deflection condition of the image shift or it is required to deflect the trajectory so as to be the trajectory of the primary charged particle beam having an optimal upper and lower ratio using a deflector other than the image shift deflector. Further, since the process monitoring apparatus used in the manufacturing process requires the automatic observation, it is required to automatically set the above-mentioned condition in accordance with the deflection distance of the image shift.

Therefore, adjustment data shown in FIG. 2 is obtained. Referring to FIG. 2, when a fixed value is used, the upper and lower ratio of the image shift is stored by associating an adjustment value, when the shift of an optical trajectory that is changed by the change in the image shift is corrected by using an optical trajectory adjuster with a deflection distance of image shift. Since dynamic focus control is controlled by a single focus system, the upper and lower ratio of the image shift may be associated only with the image shift.

Further, as a technology that automatically sets the trajectory of the primary charged particle beam that acquires an optimal resolution at the time of image shift deflection, a technology that mathematizes the off-axis aberrations of the objective lens as a function of the movement amount of the scanning area and controls the deflection angle of the deflector unit according to the equation is disclosed in Patent Literature 1 (Japanese Patent Application Laid-Open Publication No. 10-247465).

CITATION LIST

Patent Literature

Patent Literature 1: Japanese Patent Application Laid-Open Publication No. H10-247465

SUMMARY OF INVENTION

Technical Problem

In order to meet the requirement of throughput required for a charged particle microscope used in a process monitoring apparatus, a method that dynamically controls the focus of an electrostatic lens while controlling an electromagnetic lens in an electromagnetic field superposition objective lens using the electromagnetic field superposition lens formed by superimposing an electrostatic lens to an electromagnetic lens is available. However, when the above-mentioned control is performed, the following objects may exist.

(1) At the time of image shift, the trajectory is shifted from the center of the lens due to the rotation of a magnetic field lens. The excitation condition of a coil that corrects the shift of the trajectory is different between the focusing by the electromagnetic lens and the focusing by the electrostatic lens. In case of the electromagnetic lens, the rotary component of the amount of the correction acts in a direction that the rotation is cancelled because the intensity of the magnetic field is changed with respect to the change in the height direction. In contrast, in case of the electrostatic lens, since the intensity of the magnetic field does not change, the rotary component is not cancelled in response to the change in the height direction. Further, since the correction accuracy affects the resolution, the highly precise correction is required in the charged particle microscope that expects a high resolution.

(2) It is impossible to completely match the centers of the electrostatic lens and the electromagnetic lens and it is difficult for the charged particle beams to simultaneously pass through the centers of plural lenses. Therefore, the charged particle beams pass through the center of one lens. At this time, if the focus is changed in a system where the charged particle beam matches to the center of the lens, it does not occur at the same portion when the focus is changed. However, if the focus is changed in a system different from the above, the visual field moves. Further, the direction of the visual field shift is changed by the image shift. The above visual field shift becomes a factor of deteriorating the accuracy of the auto focus that determines the in-focus position by the sharpness determination while acquiring the image.

(3) The above-described phenomena of (1) and (2) act differently for every device. For example, the phenomena may occur due to the assembling accuracy of the device. Therefore, it is difficult to create devices having totally the same actions. Further, it is known that the adjustment condition for passing through the center of the lens is not stable due to the circumstantial changes such as disturbance in the long term.

According to the technology disclosed in Patent Literature 1, the above-described adjustment is corrected by a logic equation, but the above (3) cannot be satisfied.

Solution to Problem

In order to address the above-described problems, a charged particle microscope including the following means is provided.

(1) An output of an aligner coil is determined by a coil current and a voltage of the objective lens that is applied to an electrode, an acceleration voltage, and an input value of the image-shift coil.

(2) In order to suppress the visual field shift generated when a focus is varied in a system other than a focus system that passes through the center of the lens, a feedback condition that dynamically changes the image shift condition to prevent the visual field shift is determined by the coil current and the voltage of the objective lens which is applied to an electrode, an acceleration voltage, and an input value of the image shift coil.

(3) The charged particle microscope has a function that checks the validity of table data by preparing a table and an operating unit with respect to (1) and (2) for calculating by interpolating using multivariate data based on adjustment data under a representative condition of the device as an operation method that is used to determine an output value of the aligner coil.

Advantageous Effects of Invention

If the present invention is applied to a process monitoring apparatus, it is possible to provide a charged particle microscope that not only improves the throughput but also suppresses the deterioration in the resolution of an obtained image. Further, even when the present invention is applied to a microscope that has an object other than the process monitoring apparatus, it is possible to provide a charged particle microscope that easily obtains a microscopic image without deteriorating the resolution.

BRIEF DESCRIPTION OF DRAWINGS

FIG. 2 is a diagram showing adjustment data used for determining the deflection distance of an image shift.

FIG. 4 is a table determining control values of an electromagnetic objective lens and an electrostatic objective lens.

FIG. 9 is a table of a correction value used to calculate the correction distance of the visual field shift.

DESCRIPTION OF EMBODIMENTS

Hereinafter, the best mode of the present invention will be described with reference to the drawings.

First Embodiment

As a first embodiment, an embodiment that corrects an optical trajectory by changing both an electromagnetic lens and an electrostatic lens of an electromagnetic field superposition objective lens will be described.

Figure 3:
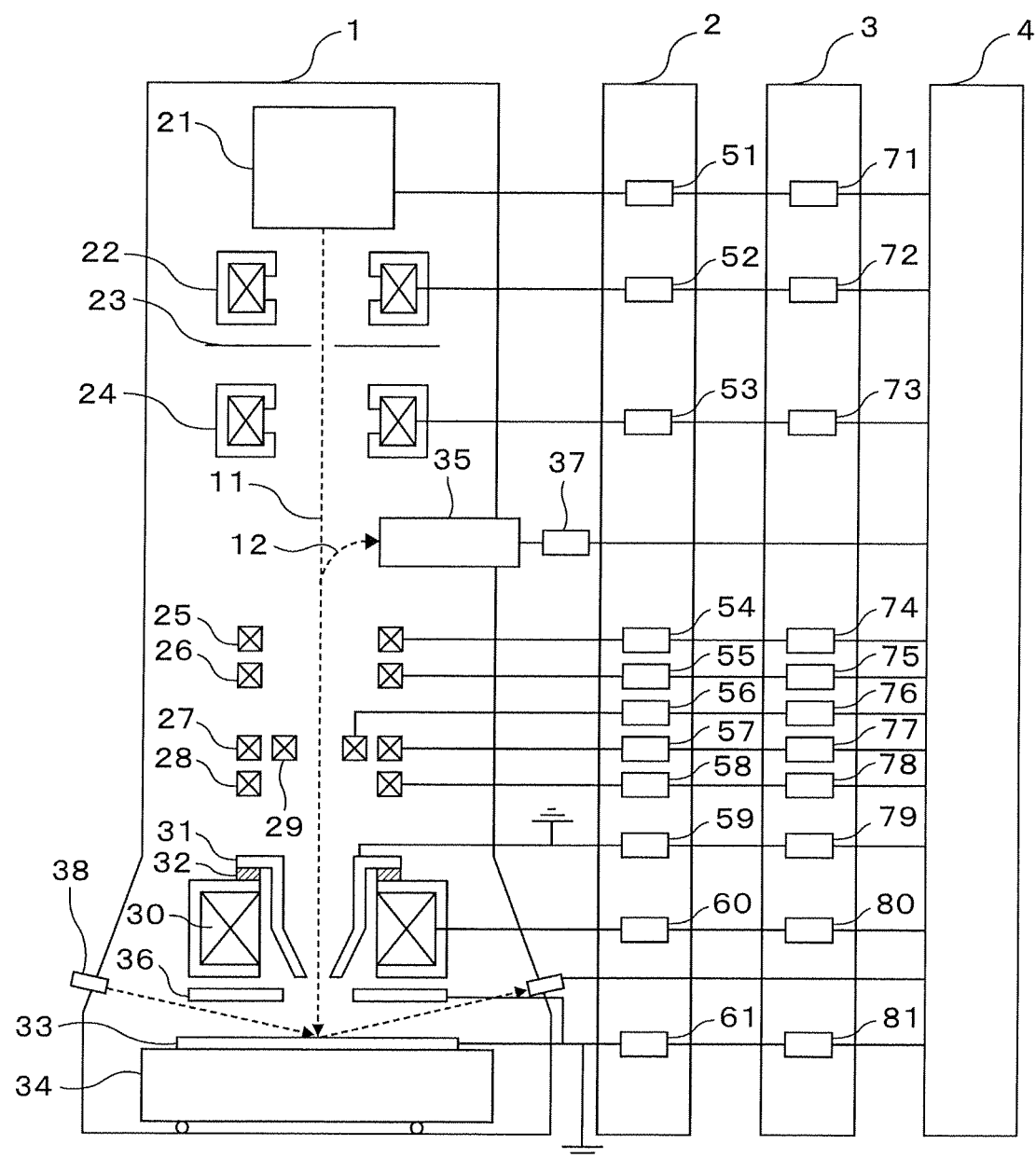
FIG. 3 is a schematic diagram showing a configuration of the scanning electronic microscope shown in the first embodiment.

FIG. 3 shows a schematic diagram of a configuration of a scanning electronic microscope according to the present embodiment. The scanning electronic microscope shown in FIG. 3 is configured by an electronic optical system tube 1, power supply units 2 that supplies various operation voltages and driving currents in the electronic optical system tube 1, and a host computer 4 that indicates a control value of a digital circuit unit 3 that controls the power supply unit 2.

The electronic optical system tube 1 is configured by an electron source 21 that generates a primary electron beam 11, an electromagnetic objective lens 30 that focuses the primary electron beam 11 onto a sample 33, a magnetic pole 31 that electrically isolates a part of a magnetic pole of the electromagnetic objective lens 30 from the electromagnetic objective lens 30 using an insulating plate 32, a first condenser lens 22 that controls a ratio of the primary electron beam 11 that passes through an aperture 23, a second condenser lens 24 that focuses the primary electron beam 11 to be incident with respect to the objective lens 30 in an appropriate range, an electrode 31 that is capable of applying a voltage that has the same potential as a voltage applied to the sample 33, a first scanning deflector 25 and a second scanning deflector 26 that two-dimensionally scan the primary electron beam 11 on a plane of the sample 33, a first image shift deflector 27 and a second image shift deflector 28 that move the center of a scanning area, an optical trajectory adjuster 29 that minutely adjusts an optical trajectory, a secondary signal detector 35 that detects a secondary signal 12 such as secondary electrons generated when the primary electron beam 11 is irradiated onto the sample 33, a sample stage 34 that fixes the sample 33, a shield electrode 36, a height measuring sensor 38 that measures a height of the sample, and the like. A voltage may be applied to the magnetic pole 31 separately from a magnetic path (not shown) that configures the electromagnetic objective lens 30, and an electric field lens is formed by a voltage that is applied to the magnetic pole 31, such that the electromagnetic objective lens 30 and the magnetic pole 31 are combined to serve as an electromagnetic field superimposed lens.

Here, an objective lens configured by the electromagnetic objective lens 30, the magnetic path, and the magnetic pole 31 is an immersion lens. The first scanning deflector 25, the second scanning deflector 26, the first image shift deflector 27, the second image shift deflector 28, and the optical trajectory adjuster 29 correspond to scanning in a direction perpendicular to the scanning plane. Therefore, the deflector and the adjuster in an X direction and a Y direction are arranged to be superposed, such that the X direction and the Y direction are individually controllable. The height measuring sensor 38 frequently measures the height of the sample in the vicinity of the point where the primary electron beam 11 is irradiated on the sample. The measurement value is converted into a distance from the reference position of the device, and transmitted to the host computer 4 through the digital circuit unit 3. Any position can be the reference position, for example, the center position of the height of the sample that assures the operation of the device may be the reference position. The sample stage 34 may independently move in two directions of an orthogonal coordinate system in a plane perpendicular to the incident direction of the primary electron beam 11 that is incident onto the sample 33. The sample stage 34 may move the sample 33 to a coordinate of an observation position indicated by the host computer 34. Further, the same potential may be applied to the sample 33 and the shield electrode 36.

The power supply unit 2 is a set of control power supplies of respective components of the electronic optical tube 1. The power supply unit 2 is configured by a voltage control power supply 51 of the electron source 21, a control power supply 52 of a first focusing lens 22, a control power supply 53 of a second focusing lens 24, a control power supply 54 of the first scanning deflector 25, a control power supply 55 of the second scanning deflector 26, a control power supply 57 of the first image shift deflector 27, a control power supply 58 of the second image shift deflector 28, a control power supply 56 of the optical trajectory adjuster 29, a coil current control power supply 60 of the objective lens 30, a voltage control power supply 59 that is applied to the magnetic pole 31, a voltage control power supply 61 that is applied to the sample 33 and the shield electrode 36.

The digital circuit unit 3 is a set of circuits that control the operation of the power supply unit 2. Control circuits are allocated to respective control power supplies in the power supply unit 2. The host computer 5 may control the operation of the respective control power supplies in the power supply unit 2 based on the digital value allocated to the respective control circuits in the digital circuit unit 3.

The secondary signal 12 of the secondary electrons generated from a sample 19 by irradiating the primary electron beam 11 is detected by the secondary signal detector 35, and the detected intensity is converted into a digital value by an analog-digital converter 37. Thereafter, the digital value is transmitted to the host computer 5 and information on the digital values is arranged in the scanning order to form the acquired image.

Figure 1:
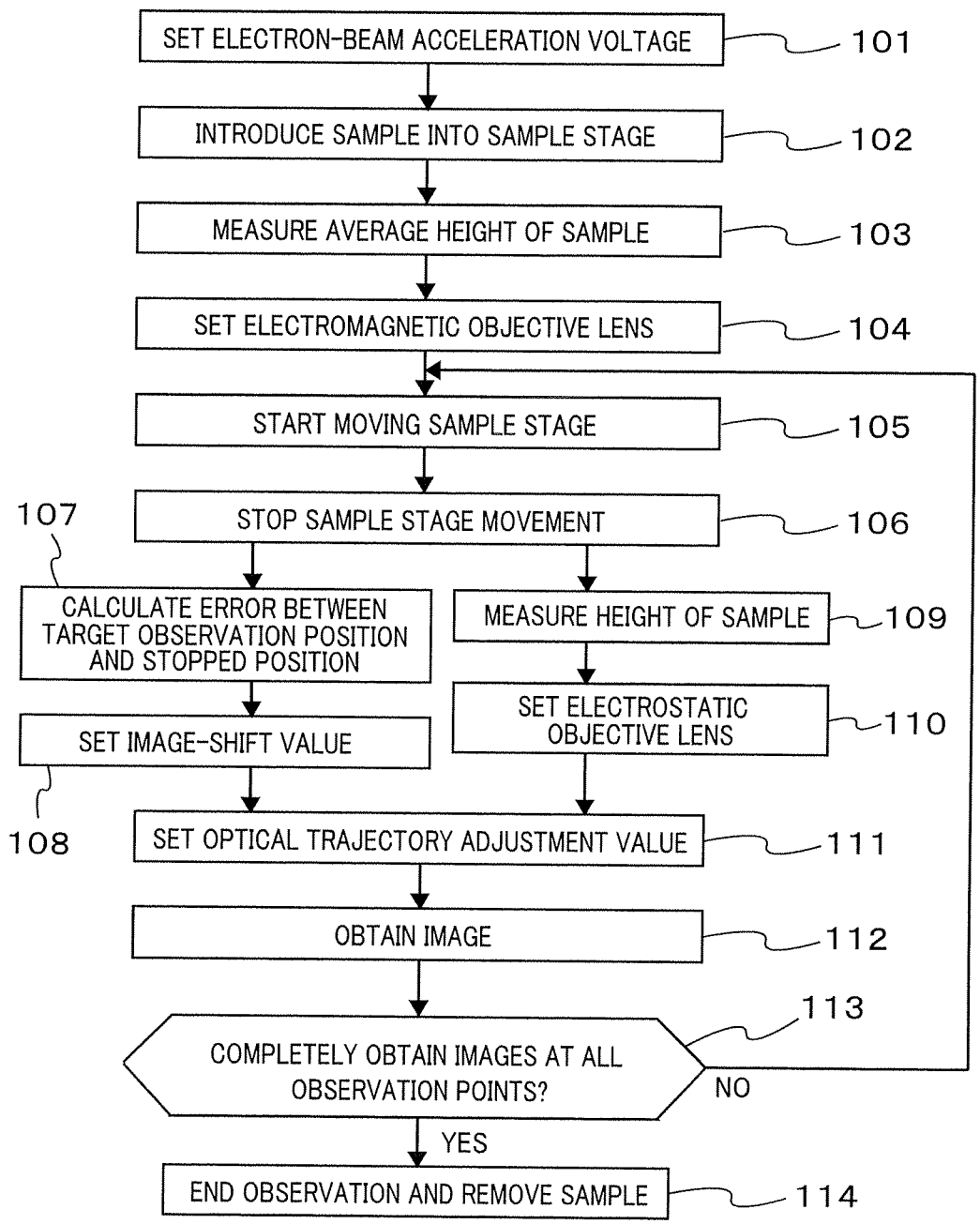
FIG. 1 is a control flow of a scanning electronic microscope shown in a first embodiment.

FIG. 1 shows a control flowchart of the scanning electron microscope that is executed by a program included in the host computer 5. First, an electron-beam acceleration voltage at the time of observation is set by "set an electron-beam acceleration voltage" 101. Next, the sample is disposed on the sample stage by "introduce a sample into a sample stage" 102. The average height of the sample is obtained by "measure the average height of the sample" 103. Here, the average height of the sample refers to the average value of height distribution of the observation sample and an average value obtained by measuring the representative position in the plane of the sample using the height measuring sensor 38. A set value of the electromagnetic objective lens is calculated from the electron-beam acceleration voltage and the average height of the sample and the control value is allocated to the control circuit 80 by "set the electromagnetic objective lens" 104, such that the electromagnetic objective lens 30 is controlled. The calculating method of the set value will be described below. In order to move the sample stage at the target observation position, "start moving the sample stage" 105 is performed. At the time when the sample stage reaches the target observation position, the sample stage stops by "stop sample stage movement" 106. At this time, since there is an error between the sample stage stop position and the target observation position, the control value is allocated to the control circuit 77 and the control circuit 78 by "set an image-shift value" 108 based on the error calculated by "calculate the error between the target observation position and the stop position" 107 and the first image shift deflector 27 and the second image shift deflector 28 are controlled, thereby correcting the error by deflecting the electron beam.

Further, concurrently with the operations of 107 and 108, the height of the sample is measured at the sample stage stop position by "measure the height of the sample" 109. The set value of the electrostatic objective lens that is calculated from the electron-beam acceleration voltage, a median value of the height of the sample, and the sample height after the sample stage is stopped by "set the electrostatic objective lens" 110 is allocated to the control circuit 79, so that the voltage applied to the electrode 31 is controlled. Accordingly, the electron beam 11 is focused on the sample. After performing "set an image-shift value" 108 and "set the electrostatic objective lens" 110, the optical trajectory adjustment value that is calculated from the electron-beam acceleration voltage, a median value of the height of the sample, the sample height after the sample stage is stopped, and the image-shift value by "set the optical trajectory adjustment value" 111 is allocated to the control circuit 76, so that the optical trajectory adjuster 29 is controlled. Thereafter, the observed image is obtained by "obtain the image" 112. In the determination sequence of "completely obtain images at all observation points?" 113, if the answer is "No", the sequence returns to "start moving the sample stage" 105 and the sequence is repeated. If the answer is "Yes", "end observation and remove the sample" 114 is performed and the observation is completed.

Next, a method of setting a set value calculated in FIG. 1 will be described. FIG. 4 shows an example of a table used for determining a focusing condition determined by control values of the electromagnetic objective lens and the electrostatic objective lens and a control condition of the optical trajectory adjuster with respect to the measurement value of the height measuring sensor 38 and the deflecting condition of the image shift deflector. In the example of the present embodiment, at acceleration voltage Va, with respect to the combinations of three conditions of average heights Z1, Z2, and Z3 of the sample, three conditions of measurement values Z1, Z2, and Z3 of heights of the sample, three conditions of control values C1, C2, and C3 of the image-shift deflector X, and three conditions of control values D1, D2, and D3 of the image-shift deflector Y, a control value of the electromagnetic objective lens and a control value of the electrostatic objective lens, a control value of the optical trajectory adjuster X and a control value of the optical trajectory adjuster Y are described. The control value of the electromagnetic objective lens and the control value of the electrostatic objective lens are obtained by adjusting the apparatus and become the condition to obtain the exact focus. Further, the control value of the optical trajectory adjuster X and the control value of the optical trajectory adjuster Y are values when the optical trajectory adjuster is controlled such that the primary electron beam passes through the center of the lens under the above condition.

The table exists for every acceleration voltage. If the apparatus is operated by changing a surface position, the table exists for every condition of the surface position to be set. The average height of the sample refers to a value that deducts the control value of the objective lens that obtains exact focus when the control value of the electrostatic objective lens is fixed as a reference value.

The respective relationships are represented by the following equations.

$$Iobj=f(Ha,Vobj=G) \quad \text{(Equation 1)}$$

$$Vobj=g(Ha,Hm) \quad \text{(Equation 2)}$$

$$ALX=s(Ha,Hm,ISX,ISY) \quad \text{(Equation 3)}$$

$$ALY=t(Ha,Hm,ISX,ISY) \quad \text{(Equation 4)}$$

Ha refers to an average height of the sample, Hm refers to the measurement value of the height of the sample, ISX refers to a control value of the image-shift deflector X, ISY refers to a control value of the image-shift deflector Y, Iobj refers to a control value of the electromagnetic objective lens, Vobj refers to a control value of the electrostatic objective lens, ALX refers to a control value of the optical trajectory adjuster X, and ALY refers to a control value of the optical trajectory adjuster Y. The above-mentioned coefficients are determined by adjusting the table. Specifically, since the control values of the electromagnetic and electrostatic objective lenses that determine the focus are dependent variables, for example, the relationship may be adjusted as follows. Since all of right sides of the equations (1) to (4) are determined by Ha, it is possible to simultaneously acquire the right sides of the equations as follows.

First, in a state where the sample moves at a position of height Z1, the control value of the image-shift deflector X is set to C2, and the control value of the image-shift deflector X is set to D2 (non-deflected status where no current is applied to each of the image-shift deflectors X and Y), the control value of the electrostatic objective lens is set to a reference value G to adjust the focus using the electromagnetic objective lens, such that the control value A1 of the electromagnetic objective lens in which the exact focus is obtained, the control value E14 of the optical trajectory adjuster X and the control value F14 of the optical trajectory adjuster Y when the primary electron beam passes through the center of the lens by adjusting the optical trajectory by the optical trajectory adjuster, are obtained. Therefore, the above values are registered as adjustment values of the average height Z1 of the sample, a measurement value Z1 of the height of the sample at the observation position, a control value C2 of the image-shift deflector X, and a control value D2 of the image-shift deflector Y. Next, only the condition of the image-shift deflectors is changed (for example, the control values are changed into a control value C1 of the image-shift deflector X and a control value D1 of the image-shift deflector Y), such that a control value E11 of the optical trajectory adjuster X and a control value F11 of the optical trajectory adjuster Y when the primary electron beam passes through the center of the lens under the above condition, are obtained. Since the focus condition is changed by the change in the average height of the sample and the measurement value of the height of the sample, the previously obtained set values (G and A1) are used here. With the same average height of the sample and measurement value of the height of the sample, after obtaining the adjustment data under the respective image-shift conditions, under the status where the average height of the sample is fixed to Z1, the height of the sample is changed, and the measurement values of the height of the sample are changed into Z2 and Z3. Further, the focus is adjusted by the electrostatic objective lens and the control values G+G1 and G+G2 of the electrostatic objective lens at this time are obtained. The adjustment value of the optical trajectory adjuster when the image is shifted under the respective focusing condition is obtained by changing the image shift using the same method as described above. The adjustment is also performed equally for the average heights Z2 and Z3 of the sample, and the table is completed with respect to the combination of the three conditions of the average heights Z1, Z2, and Z3 of the sample and the three conditions of the measurement values Z1, Z2, and Z3 of the height of the sample. Therefore, the coefficients of Equations 1 to 4 are determined from the values of the table. Here, if Z1, Z2, and Z3 are considered as combinations of a minimum value, a median value, and a maximum value of the height of the sample of an operation guarantee range of the device, and C1, C2, and C3 and D1, D2, and D3 are considered as a minimum value, a non-deflection value, and a maximum value of the operation range of the image-shift deflector, since the above-mentioned calculation is performed only by interpolation, the error between the output value that is supposed to be obtained by adjusting the input value and the output value obtained by calculation becomes small and preferable.

Further, according to the present embodiment, even though the adjustment is performed under the three input conditions, the height of the sample to be adjusted is not limited to the three conditions, but the number of conditions is appropriately changed depending on the required accuracy of the focus setting and the correction function. When the optical trajectory adjusters X and Y are adjusted, in case of the combination of the minimum value, the median value, and the maximum value to be controlled by the input value described in the table, the input values which can beset by the apparatus are values larger than the minimum value of the input value to be described in the table and smaller than the maximum value of the input value. The output value is calculated by interpolation when the input value is a value other than the value described in the table. Here, it is important that the size tolerance and the assembling tolerance of the objective lenses or the deflectors are factors that cause the asymmetry property in the above-described equations, specifically, in controlling the optical trajectory deflector. Since the correction function is varied depending on the cause of the asymmetry property, if the cause is accurately corrected, the function becomes a higher order function. Accordingly, the number of adjustment points for determining the coefficients of the function is increased. In order to avoid the increase, for example, a spline function may be introduced to the above-mentioned function. The spline function may be introduced to all of the functions. Otherwise, if a function accurately determined is required for the symmetry component is required, the spline function may be introduced to the asymmetry component to use the sum of the symmetry component and the asymmetry component.

Figure 5A:
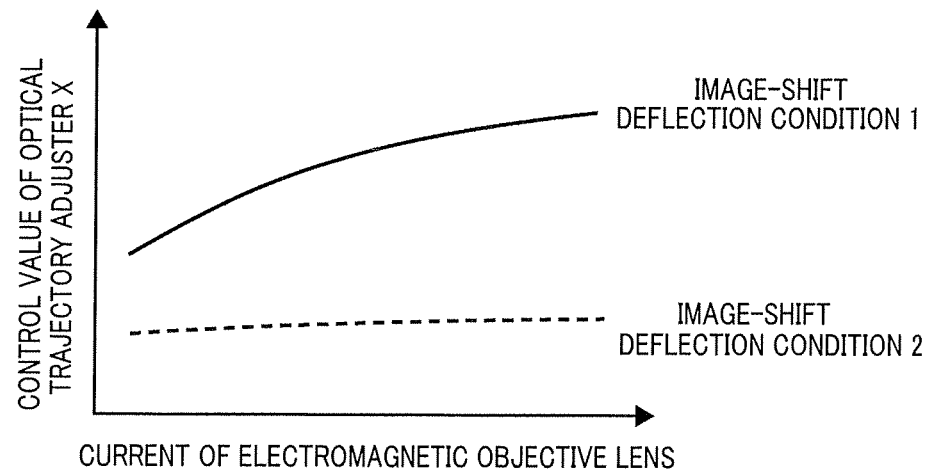
FIGS. 5A and B are diagram showing behaviors of control current of optical trajectory adjusters X and Y when the image shift deflection condition is used as a parameter.
Figure 5B:
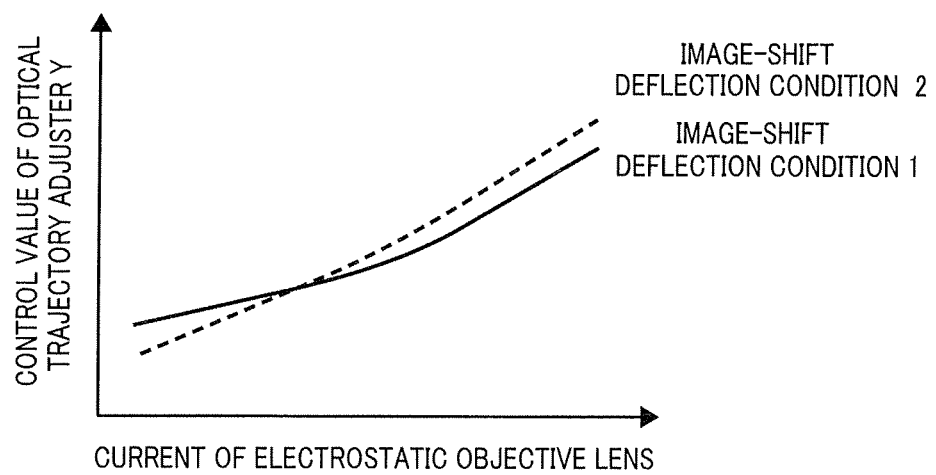

From the above-mentioned control relationships, if the current of the electromagnetic objective lens, the voltage of the electrostatic objective lens, the control currents of the optical trajectory adjusters X and Y are monitored, it is confirmed that if the control currents of the optical trajectory deflectors X and Y when the height of the sample is fixed and the current of the electromagnetic objective lens and the voltage of the electrostatic objective lens are changed so as to obtain the exact focus, are obtained under the different image-shift conditions (only one of image shift deflectors X and Y may have different image-shift condition), for example, as shown in FIGS. 5A and B, the control currents of the optical trajectory deflectors X and Y with respect to the current of the electromagnetic objective lens show different behaviors depending on the image-shift condition.

Further, the input value described in the table may not include the minimum value and the maximum value to be controlled. In this case, the output value for values other than the input value described in the table in this case is calculated by interpolation or extrapolation. However, in a case where the output value obtained by the extrapolation is in the range where the deviation for an ideal control value to be set is small and it does not largely affect the degradation of the resolution, the output value is preferable. For example, the acceptable range may be defined to be within 10% of degradation of the resolution.

Therefore, the optical trajectory deflector 29 can be appropriately controlled using the above-described control method, such that a clear image without degradation of the resolution can be obtained.

Second Embodiment

Figure 6:
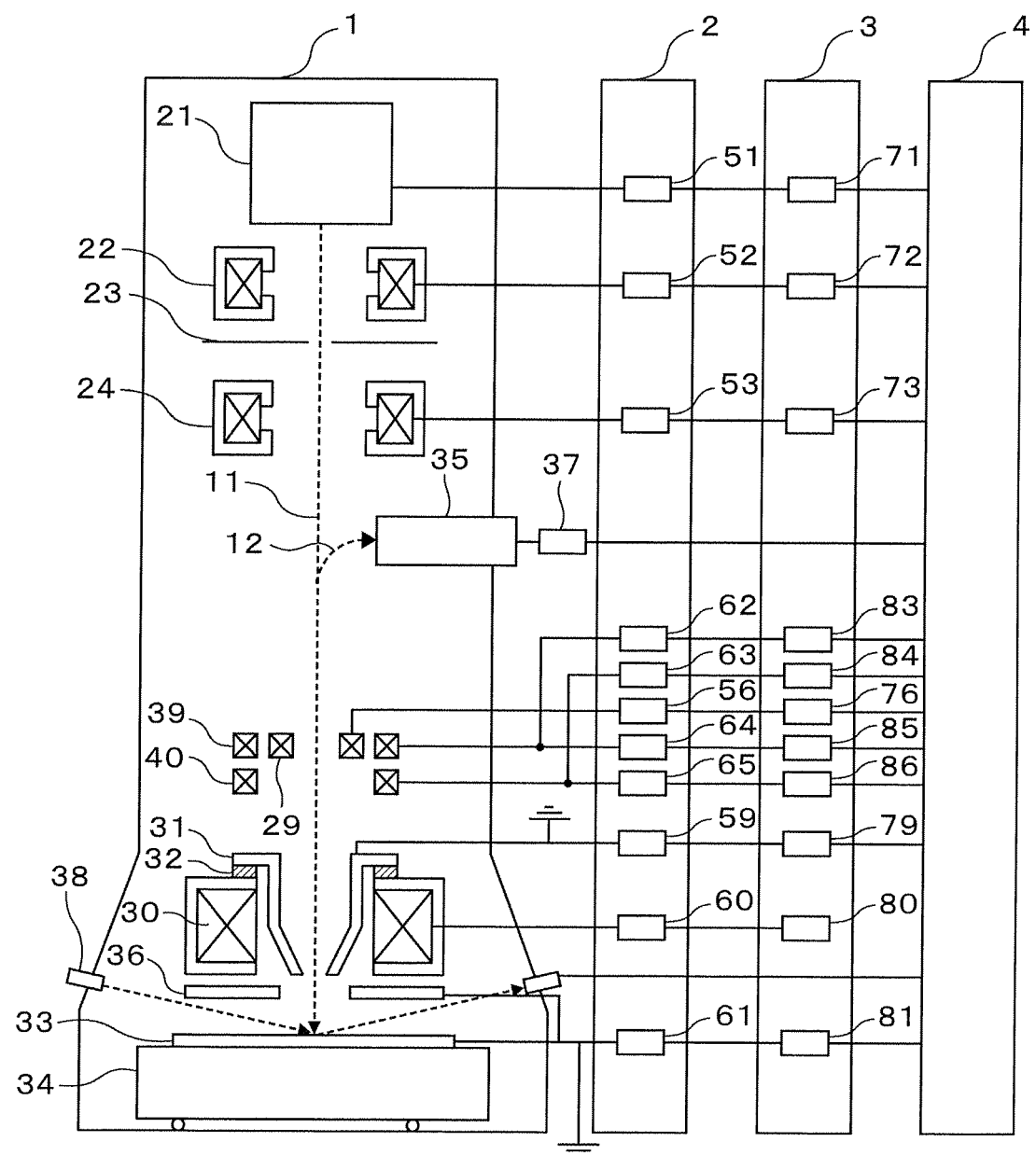
FIG. 6 is a schematic diagram showing a configuration of the scanning electronic microscope shown in a second embodiment.

As a second embodiment, a configuration that performs the scanning deflection and the image-shift deflection using the same deflector may be used. The configuration of the present embodiment is shown in FIG. 6. In the configuration of the present embodiment, the scanning deflection and the image-shift deflection are performed by the same deflector. That is, in this configuration, the first scanning deflector 25, the second scanning deflector 26, the first image-shift deflector 27, and the second image-shift deflector 28 disclosed in the first embodiment are replaced with a first deflector 39 and a second deflector 40. The first deflector 39 is controlled by an added value of a scanning control power supply 62 of the first deflector and an image-shift control power supply 64 of the first deflector and an added value of a scanning control power supply 63 of the second deflector and an image-shift control power supply 65 of the second deflector.

Here, the cycles of the scanning control power supplies 62 and 63 described above are different from each other. The scanning control power supplies 62 and 63 output an alternating current component whose amplitude is changed with respect to the observation range of a display image. The image-shift control power supplies 64 and 65 output a direct current component that changes depending on the observation center of the display image. The image shift is realized by adding the output current components to change the median value of the scanning deflection current. Since the other configurations of the apparatus and the method of obtaining adjustment data are the same as those of the first embodiment, the description thereof will be omitted.

With this configuration, since the deflection position is determined by the deflectors, it is possible to optimize not only the optical trajectory at the time of image-shift deflection, but also the optical trajectory at the time of scanning deflection by the correction function at the time of image-shift deflection.

Further, in this embodiment, the alternating current component current and the direct current component current that control the deflector are independently controlled and added. However, if the control current of the same deflector can be formed, for example, the same effect can be obtained even in a configuration that the added value of the alternating current component control value of the direct current component control value that are used as control values of the digital controller is directly input to the control power supply and controlled. Further, two deflectors that can superimpose the scanning deflection control current and the image-shift deflection control current are arranged, and independently used as the scanning deflector and the image-shift deflector as in the configuration described in the first embodiment to optimize the optical trajectory for each of the deflectors.

By the control described above, the optical trajectory adjuster 29 is appropriately controlled, so that a clear image without degradation of the resolution can be obtained.

Third Embodiment

As a third embodiment, an embodiment using a plurality of electrostatic objective lenses as objective lenses that reduces the change in a beam landing position with respect to the sample when the focus is changed will be described.

Figure 7:
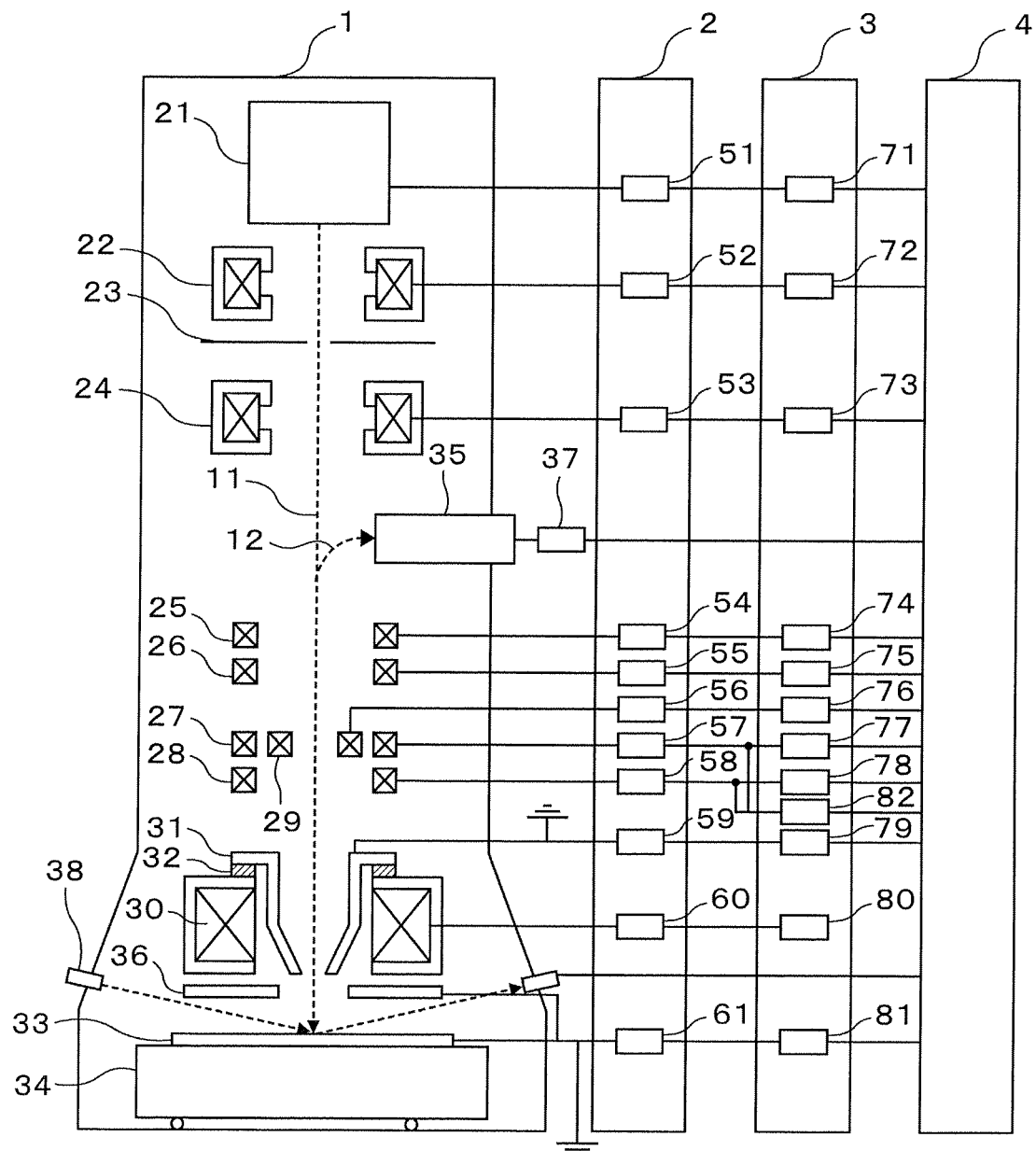
FIG. 7 is a schematic diagram showing a configuration of a scanning electronic microscope shown in a third embodiment.

FIG. 7 shows a schematic diagram of a configuration of a scanning electron microscope according to the present embodiment. According to the configuration of the apparatus, a control circuit 82 for controlling the beam landing position is newly added as compared with the configuration of the apparatus according to the first embodiment. The control value of the control circuit 82 is added to the control values of the control circuit 77 and the control circuit 78 to be used to control the control power supply 57 and the control power supply 58 as a new control value. Further, according to the present embodiment, the electrostatic lens that is used to control the focus as an objective lens includes two kinds of electrostatic lenses. One lens is a lens that sets a focus condition corresponding to the height measured by the height measuring sensor 36, using a lens operated by applying a voltage to the magnetic pole 31. The other lens is a lens that adjusts a focus, which cannot be set by the lens operated by applying voltage to the magnetic pole 31, using a lens operated by applying voltage to the sample 33 and the shield electrode 36. Since the other configurations of the apparatus are the same as those of the first embodiment, the description thereof will be omitted.

Figure 8:
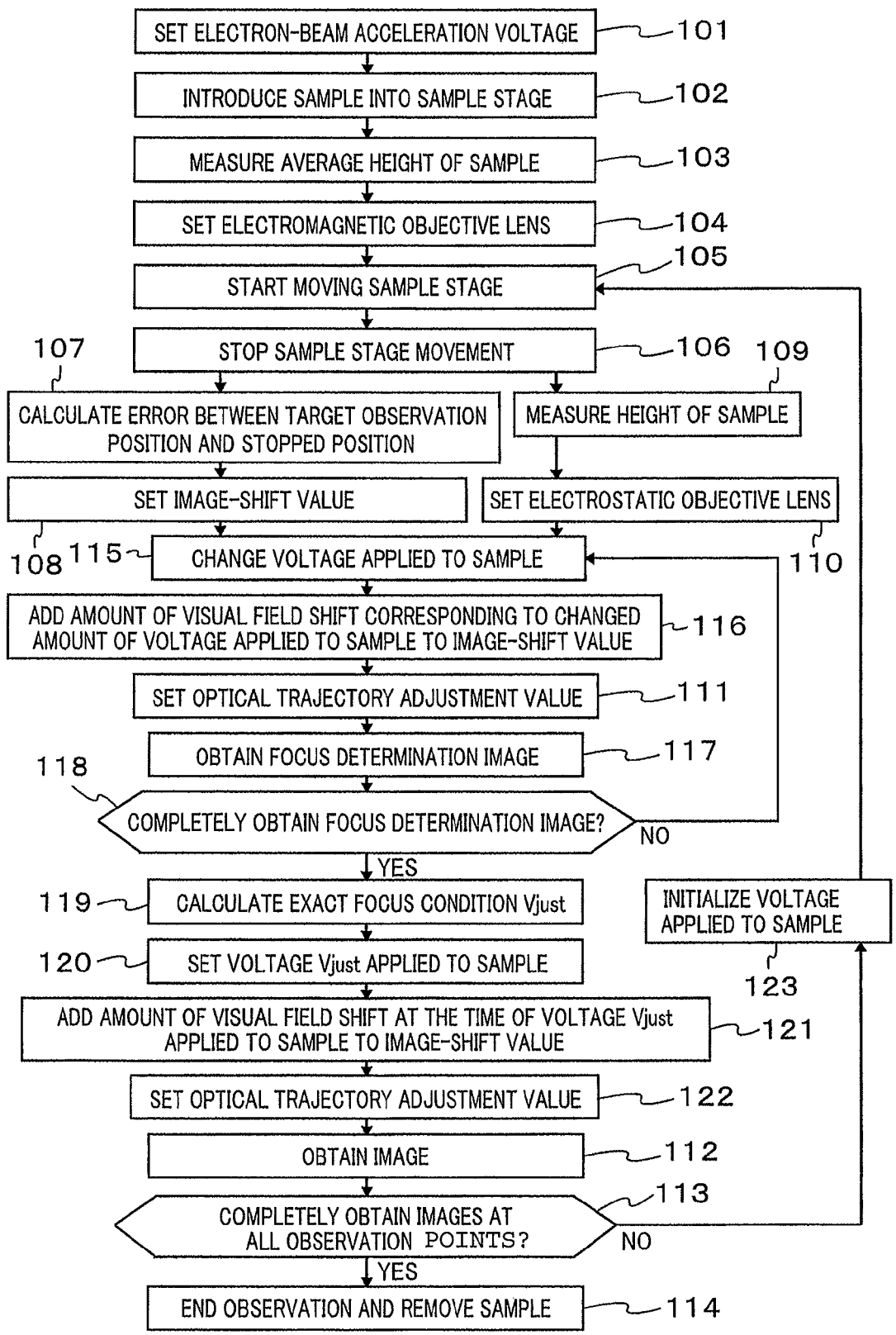
FIG. 8 is a control flowchart of the scanning electronic microscope shown in the third embodiment.

FIG. 8 shows a control flowchart of the scanning electron microscope executed by a program in the host computer 5. Since the flows from "set an electron-beam acceleration voltage" 101 to "set the electrostatic objective lens" 110 are the same as the control flow shown in FIG. 1 of the first embodiment, the description thereof will be omitted. If "set an image-shift value" 108 and "set the electrostatic objective lens" 110 are performed, the focus determination sequence is performed. In the focus determination sequence, an image is obtained while changing the focus condition and a focus condition that is expected as exact focus is calculated from the sharpness of the obtained image, and the sequence to set the focus condition is performed.

Hereinafter, the flows of the focus determination sequence will be described. After performing "change the voltage applied to the sample" 115, a sequence of "add the amount of visual field shift corresponding to the changed amount of the voltage applied to the sample to the image-shift value" 116 is performed. Therefore, a value that is obtained by calculating the amount of visual field shift occurring at the time of changing the voltage applied to the sample based on data of the correction table that is previously stored in the host computer 4 is allocated to the control circuit 82 so that the control power supplies 57 and 58 are controlled. Further, the above-mentioned "change the voltage applied to the sample" 115 is performed by changing the voltage to be applied to the sample 33 and the shield electrode 36 from the voltage control power supply 61, as described in the first embodiment. In "set optical trajectory adjustment value" 111, an optical trajectory adjustment value corresponding to the image-shift value reset in 116 is set. Thereafter, after obtaining the image in "obtain a focus determination image" 117, if it is not completed in "completely obtain a focus determination image?" 118, the sequence returns to sequence 115 to repeat sequences 116, 111, and 117. If it is completed in sequence 118, the sequence of "calculate an exact focus condition Vjust" 119 is performed to calculate voltage Vjust applied to the sample that determines in-focus position from an evaluation value of the obtained focus determination image. The obtained calculation value of the focus condition is reflected in the set value Vjust of the voltage applied to the sample in the sequence of "set the voltage Vjust applied to the sample" 120. If the voltage applied to the sample is changed with respect to an initial value, the visual filed shift occurs. Therefore, in the sequence of "add amount of the visual field shift at the time of the voltage Vjust applied to the sample to the image-shift value" 121, the image-shift value is added so as to return the amount of occurred visual field shift. In this case, since the optimal condition that passes through the optical trajectory is changed, in the sequence of "set an optical trajectory adjustment value" 122, "obtain the image" 112 is performed after setting the optical trajectory adjustment value corresponding to the image-shift value set in 121. Since the method of setting the optical trajectory adjustment value in the present embodiment is the same as the method described in the first embodiment, the description thereof will be omitted. If a part to be observed remains in the determination of "completely obtain images at all observations points?" 113, after performing "initialize the voltage applied the sample" 123, the operations of 105 and subsequent sequences are repeated. If there is no part to be observed in the determination of 113, "end observation and remove the sample" 114 is performed and the observation is completed.

FIG. 9 shows an example of a table of correction value used to calculate the correction amount of the visual field shift of the above sequences 116 and 121. In the present embodiment, at the acceleration voltage Va, with respect to the combinations of three conditions of average heights Z1, Z2, and Z3 of the sample, three conditions of measurement values Z1, Z2, and Z3 of heights of the sample, three conditions of control values C1, C2, and C3 of the image-shift deflector X, and three conditions of control values D1, D2, and D3 of the image-shift deflector Y, a control value of the visual field shift correction X and a control value of the visual field shift correction Y that are obtained by adjusting the apparatus, are described. That is, the input and output relationship is as follows: the average height of the sample, the measurement value of the height of the sample, the control value of the image-shift deflector X, and the control value of the image-shift deflector Y are input values and the control value of the visual field shift correction X and the control value of the visual field shift correction Y are output values. Like the table shown in FIG. 4 according to the first embodiment, this table exists at every acceleration voltage. Further, if the apparatus is operated by changing a surface position, the table exists at every condition of the surface position to be set. Since the method of calculating the output value using the table is the same as the method of calculating using the table shown in FIG. 4 of the first embodiment, the description thereof will be omitted.

It is possible to determine a focus without generating the visual field shift by the above-described control. As a result, it is possible to obtain a clear image without erroneously determining the focus.

Fourth Embodiment

As a fourth embodiment, an operation that sets a criterion for judgment whether it is required to correct the optical trajectory correction table will be described. Since the configurations of the apparatus and the method of correcting the optical trajectory are the same as those described in the first embodiment and the second embodiment, the description thereof will be omitted.

Figure 10:
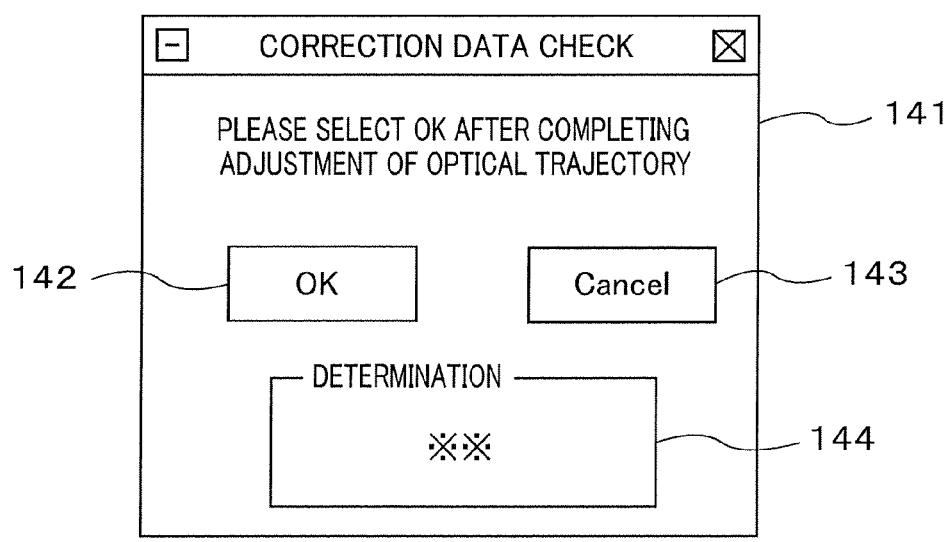
FIG. 10 is a diagram showing an example of a check screen of a reliability of correction data.

FIG. 10 shows an example of a check screen of a reliability of the correction data. The correction data check screen 141 includes an OK command button 142, a cancel command button 143, and a reliability determination display screen 144. If the correction data check screen 141 is displayed, a sequence that checks the reliability of the correction data using the relative deviation between the calculation value obtained from the correction data and an actual measured value is operated.

Figure 11:
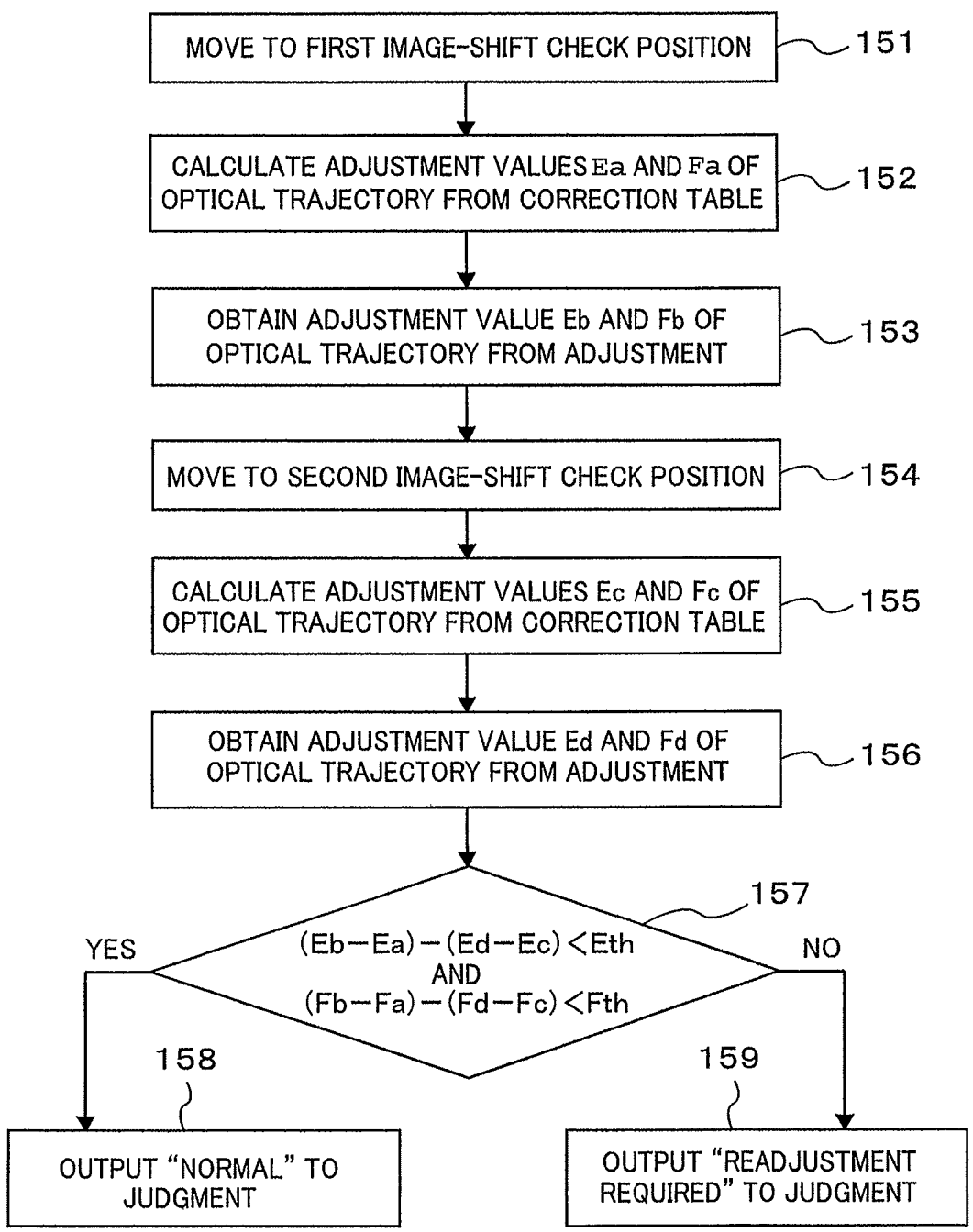
FIG. 11 is a diagram showing an example of an operation sequence when the reliability of correction data is checked.

FIG. 11 shows an example of an operation sequence when the reliability of correction data is checked according to the present embodiment. First, if "move to first image shift check position" 151 is performed, a correction value that is calculated from the correction table at the first image shift check position is obtained by "calculate adjustment values Ea and Fa of the optical trajectory from the correction table" 152. Since the sentence "please select OK after completing the adjustment of the optical trajectory" is displayed on the correction data check screen 141, "obtain adjustment value Eb and Fb of the optical trajectory from the adjustment" 153 is performed by manual adjustment. If the OK command button 142 is clicked, "move to second image-shift check position" 154 is performed, and a correction value that is calculated from the correction table at the second image shift check position is obtained by "calculate adjustment values Ec and Fc of the optical trajectory from the correction table" 155. Since the sentence "please select OK after completing the adjustment of the optical trajectory" is displayed on the correction data check screen 141, "obtain adjustment value Ed and Fd of the optical trajectory from the adjustment" 156 is performed by manual adjustment. If the OK command button 142 is clicked, a judgment sequence of "(Eb−Ea)−(Ed−Ec)<Eth and (Fb−Fa)−(Ed−Ec)<Eth" is performed. In this sequence, it is judged whether the following equations 5 and 6 are satisfied.

$$(Eb-Ea)-(Ed-Ec)<Eth \qquad \text{(Equation 5)}$$

$$(Fb-Fa)-(Ed-Ec)<Eth \qquad \text{(Equation 6)}$$

Eth and Fth refers the acceptable value of the deviation of an adjustment value at a previously set.

If equations 5 and 6 are satisfied, it is determined that the correction is not required, and "output "normal" to judgment" 158 is performed. In contrast, if equations 5 and 6 are not satisfied, "output "readjustment required" to judgment" 159 is performed, such that it is notified to a user that readjustment of the adjustment data is required.

According to the embodiment, it is possible to easily check the reliability of the adjustment data.

REFERENCE SIGNS LIST

1 . . . Electronic optical system tube
2 . . . Power supply unit
3 . . . Digital circuit unit
4 . . . Host computer
11 . . . Primary electron beam
21 . . . Electron source 22 ... First condenser lens
23 ... Aperture
24 ... Second condenser lens
30 ... Electromagnetic objective lens
31 ... Magnetic pole
32 ... Insulating plate
33 ... Sample
25 ... First scanning deflector
26 ... Second scanning deflector
27 ... First image shift deflector
28 ... Second image shift deflector
29 ... Optical trajectory adjuster
35 ... Secondary signal detector
34 ... Sample stage
36 ... Shield electrode
38 ... Height measuring sensor
51, 59, 61 ... Voltage control power supply
52, 53, 54, 55, 56, 57, 58 ... Control power supply
60 ... Coil current control power supply

The invention claimed is:

1. A charged particle microscope, comprising:
a stage holding a sample to be measured;
a charged particle optical tube that detects a secondary signal generated by two-dimensional scanning a charged particle beam onto the sample and having an objective lens that focuses the charged particle beam onto the sample and a height measuring device that measures a height of the sample; and
a controller configured to control the objective lens, wherein the objective lens is configured by a plurality of lenses including an electromagnetic lens and an electrostatic lens,
wherein the controller is configured to calculate a set value of the electromagnetic lens based on an average height of the sample before the stage starts moving the sample to a target observation position for the first time, and
wherein the controller is configured to calculate a set value of the electrostatic lens based on a height of the sample at a stop position of the stage after the stage starts moving the sample to the target observation position.

2. The charged particle microscope according to claim 1, wherein the average height of the sample is an average value obtained by measuring representative positions of the sample using the height measuring device.

3. The charged particle microscope according to claim 1, wherein the set value of the electromagnetic lens is calculated from an acceleration voltage of the charged particle beam and the average height of the sample, and
wherein the set value of the electrostatic lens is calculated from the acceleration voltage of the charged particle beam, a median value of the height of the sample and the height of the sample after the stage is stopped.

4. The charged particle microscope according to claim 1, wherein the controller further calculates an error between the target observation position and the stop position.

5. The charged particle microscope according to claim 1, further comprising: a deflector that sets a center of the scanning to a desired position in a scanning area on the sample; and an optical axis adjuster that reduces off axis aberrations of the objective lens occurring when the charged particle beam is set in the center of the scanning area.

6. The charged particle microscope according to claim 5, wherein the deflector is configured by an image shift deflector.

7. The charged particle microscope according to claim 5, wherein the deflector is configured by an image shift deflector and a scanning deflector.

* * * * *